United States Patent [19]

Carnes et al.

[11] 4,307,411

[45] Dec. 22, 1981

[54] NONVOLATILE SEMICONDUCTOR MEMORY DEVICE AND METHOD OF ITS MANUFACTURE

[75] Inventors: James E. Carnes, North Brunswick, N.J.; Murray H. Woods, Palo Alto, Calif.

[73] Assignee: RCA Corporation, New York, N.Y.

[21] Appl. No.: 873,603

[22] Filed: Jan. 30, 1978

[51] Int. Cl.³ .......................................... H01L 29/78
[52] U.S. Cl. ...................................... 357/23; 357/54; 357/91; 148/1.5; 29/576 R
[58] Field of Search ........................... 357/23, 54, 91; 148/1.5; 29/576

[56] References Cited

U.S. PATENT DOCUMENTS 3,719,866  3/1973  Naber et al. ................... 357/54
4,011,576  3/1977  Uchida et al. .................. 357/54

Primary Examiner—Edward J. Wojciechowicz
Attorney, Agent, or Firm—Birgit E. Morris; Donald S. Cohen; Sanford J. Asman

[57] ABSTRACT

An MNOS nonvolatile semiconductive memory device of the type which has a thick gate insulating layer overlapping the source and drain regions and a thin gate insulator layer in the memory portion of the device includes a region of relatively high concentration of impurities of the same type conductivity as the substrate in the portion of the channel which is beneath the thin gate insulating layer. This increases the values of both the low threshold and the high threshold states of the memory portion of the device so as to increase the threshold voltage window of the device.

8 Claims, 4 Drawing Figures

NONVOLATILE SEMICONDUCTOR MEMORY DEVICE AND METHOD OF ITS MANUFACTURE

This invention relates to nonvolatile semiconductive memory devices and particularly to those known as MNOS field effect transistors.

MNOS devices employed as binary storage devices are well known. In early MNOS structures, the gate insulating layers were a silicon dioxide layer of about 20 Å in thickness on the surface of the substrate body and a silicon nitride layer on the silicon dioxide layer. The thin silicon dioxide layer overlapped the source and drain PN junctions and the result was that the breakdown voltage of the drain relative to the substrate was relatively low. The breakdown voltage between the drain and the source relative to the gate also was relatively low. Efforts to solve the breakdown voltage problem in MNOS devices led to structures such as those disclosed in an article entitled, "The Drain Source Protected MNOS Memory Device and Memory Endurance", at the 1973 International Electronic Devices Meeting, at pages 126–128. In that structure, a relatively thick gate oxide layer overlaps the source and drain and lies over source and drain adjacent portions of the channel region so that the thin gate oxide, i.e. the memory portion of the device, is located centrally in the channel and over only a portion of the channel. While that device did solve the breakdown voltage problem and exhibit a bivalued threshold voltage, the difference between the low and high threshold states (commonly called the threshold window) is relatively small.

A method of increasing the difference between the low and high threshold states of an MNOS device is described in U.S. Pat. No. 4,011,576 which issued to Uchida et al on Mar. 8, 1977. In that device, the portions of the channel which underlie the thicker portions of the gate oxide layer are doped lightly with conductivity modifiers of the type opposite to that of the substrate. That decreases the effective threshold voltage of these portions while the two threshold states of the memory portion of the device remain the same thereby increasing the threshold window.

An alternative method of increasing the threshold window is desirable.

Figure 1:
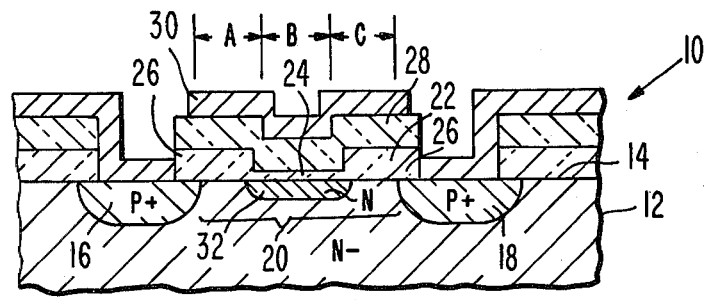
FIG. 1 is a diagrammatic partial cross-sectional view of the present MNOS device.

The present, improved nonvolatile MNOS semiconductive memory device 10 is illustrated in FIG. 1. The device 10 is formed in a body of semiconductor material 12, usually silicon, of one type conductivity (N− type in this example) which has a surface 14 adjacent to which the elements of the device 10 are formed. Spaced source and drain regions, 16 and 18, are in the body 12 adjacent to the surface 14 and define the ends of a channel region 20 of controllable conductivity. The general relation to the source and drain regions, 16 and 18, and the channel region 20 is similar to standard practice in the art.

A first insulating layer 22 is disposed on the surface 14 of the body 12 over the channel region 20. The first insulating layer 22 has a thin, charge-tunnelling portion 24 over part of the channel region 20 and a thick non-tunnelling portion 26 over the rest of the channel region 20. In this example, the thin portion 24 of the first insulating layer 22 is disposed centrally over the channel region 20 so that the part of the channel region 20 beneath the thin portion 24 of the first insulating layer 22 has ends spaced from each of the source and drain regions 16 and 18. Other relative structures of the thin and thick portions of the first insulating layer 22 may also be used, such as the structure shown in FIG. 2 in U.S. Pat. No. 3,719,866 issued to Naber et al on Mar. 6, 1973.

Typically, when the material of the body 12 is silicon, the first insulating layer 22 is of thermally grown silicon dioxide. The thin portion 24 of the first insulating layer 22 usually has a thickness of about 20 Å, although thicknesses up to about 50 Å are acceptable. The thick portion 26 of the first insulating layer 22 is also of thermally grown silicon dioxide, having a thickness of about 500 Å.

A second insulating layer 28, usually of silicon nitride (although other materials such as aluminum oxide are also acceptable) and about 500 Å thick, is disposed on the first insulating layer 22. A conductive gate electrode layer 30 is on the second insulating layer 28 and the relationship between the gate electrode layer 30 and the insulating layers 22 and 28 is generally the known relationship of the prior art, as described in the Naber et al patent referred to above.

Unlike known devices, the present device 10 is characterized by the presence of a zone 32 in at least a portion of the channel region 20 beneath the thin portion 24 of the first insulating layer 22. The zone 32 has a concentration of conductivity modifiers (N type in this example) which is greater than the concentration of conductivity modifiers in the portion of the channel region 20 which lies beneath the thick portion 26 of the first insulating layer 22. In the example illustrated, the zone 32 underlies all of the thin portion 24 of the first insulating layer 22 and extends a short distance laterally beneath the thick portion 26 of the first insulating layer 22. This is a result of the processing used to make the device 10. Because the parts of the zone 32 which overlap the thick portion 26 of the first insulating layer 22 will affect the overall threshold conditions of the device, care should be taken to keep this overlap to a minimum.

Figure 2:
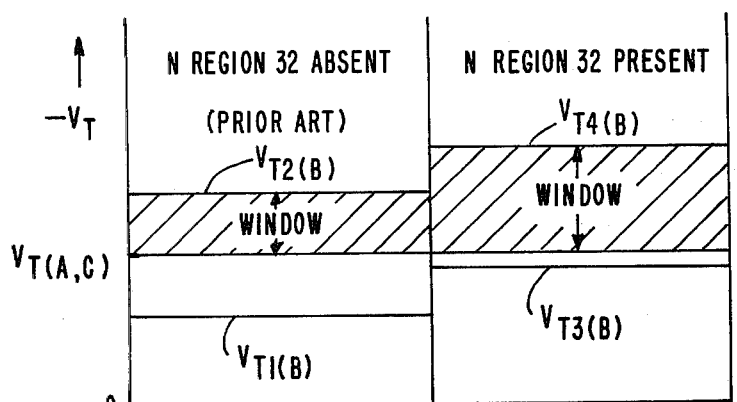
FIG. 2 is a diagram illustrating the relationship of the threshold window of the present device to that of one type prior art structure.

The effect of the presence of the conductivity modifiers in the zone 32 of the channel region 20 on the threshold window of the device is illustrated in FIG. 2, which compares the present device 10 to a device like the Naber et al device referred to above, i.e. one which lacks a zone like the zone 32. In this diagram, a horizontal line $V_{T(A,C)}$ represents the threshold voltage of the portions of the device having the thick portion 26 of the first insulating layer 22 beneath the gate electrode 30 (labeled as A and C in FIG. 1). For comparative purposes, it is assumed that this threshold voltage is the same for the prior art device and the present device 10. The two threshold states of the memory portion of the prior art device are labeled $V_{T1(B)}$ and $V_{T2(B)}$ in FIG. 2. In this example, the value of $V_{T1(B)}$ is less negative than the value of $V_{T(A,C)}$ and the value of $V_{T2(B)}$ is more negative than $V_{T(A,C)}$. The device can be thought of as two transistors in series, and the threshold window of the device is the voltage difference between that of one transistor, $V_{T(A,C)}$ and that of the high state of the other transistor, $V_{T2(B)}$. When the memory threshold is at $V_{T2(B)}$, the device can conduct only when the voltage on the gate electrode 30 has a value greater (more negative) than $V_{T2(B)}$. When the memory threshold is at $V_{T1(B)}$, the device can conduct only when voltage on the gate electrode 30 is above $V_{T(A,C)}$. The voltage used to read the device must be between these two values.

The effect of the additional conductivity modifiers in the zone 32 of the present device 10 is represented on the right side of FIG. 2. The assumption is made that the absolute value of the voltage difference between the two states of the memory portion of the device 10 is the same as that in the prior art device, but the actual values of the two states, labeled $V_{T3(B)}$ and $V_{T4(B)}$, are more negative than the comparable values in the prior art device, owing to the presence of the zone 32. Thus, although higher negative voltages are required to operate the present device 10, the threshold window is expanded. The present device 10 may, therefore, be read more accurately because less precise values of the read voltage on the gate electrode may be tolerated. Additionally, it has been found that the memory retention time of the device is increased. The lowering of the threshold of the thick insulator portions of the device as described in U.S. Pat. No. 4,011,576 issued to Uchida et al provides a similar result.

Figure 3:
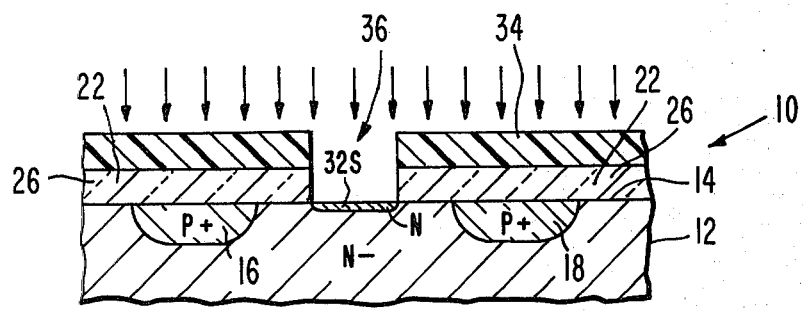
FIGS. 3 and 4 are diagrammatic, partial cross-sectional views illustrating steps in the present process.
Figure 4:
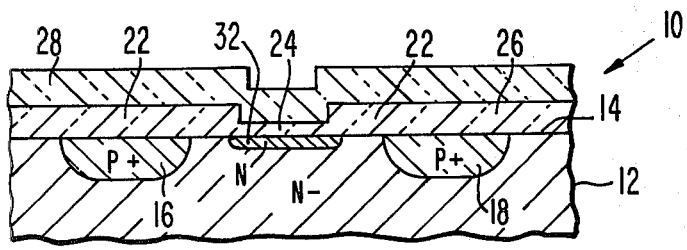

The present method of making an MNOS memory device is illustrated in FIGS. 3 and 4. The steps illustrated are those which characterize the present invention and other steps which are conventionally performed are omitted for clarity.

The cross-section of FIG. 3 represents the condition of the device 10 after the formation of the source and drain regions 16 and 18 and the formation of thick portion 26 of the first insulating layer 22. A photoresist layer 34 is provided on the upper surface of the thick portion 26 of the first insulating layer 22 and is exposed to define the location, generally designated as 36, of the thin portion 24 of the first insulating layer 22. After the photoresist layer 34 is defined and developed, the thick portion 26 is etched down to the surface 14 of the body 12. Thus far the processing is conventional.

In the prior art the thin tunnelling gate insulator is next formed. However, in the present process conductivity modifiers are now introduced into the portion of the channel region 20 which will eventually lie beneath the thin portion 24 of the first insulating layer 22 and which increase the concentration thereof in that portion 32 of the channel region 20 to a value higher than the concentration of modifiers in the portion of the channel region 20 beneath the thick portion 26 of the first insulating layer 22. Preferably, this introduction step is carried out by subjecting the device 10 to a beam of phosphorus ions in a conventional ion implantation apparatus. This produces a shallow N-type zone 32S in the body 12 adjacent to the location 36. Typically, the energy of the implant is about 45 KeV and the dose may be $5 \times 10^{11}$ atoms/cm$^2$.

After the implantation step, conventional processing is resumed. The photoresist layer 34 is removed and the device 10 is subjected to thermal oxidation for a time sufficient to form the thin portion 24 of the first insulating layer 22. Then the silicon nitride layer 28, shown in FIG. 4, is formed by a conventional chemical vapor deposition process. These processes involve heating the device 10 and will cause diffusion of conductivity modifiers from the initial region 32S to new locations within the body 12, thus forming the portion 32 of the channel region 20. Some side diffusion will take place producing the overlap condition mentioned above. The times and temperatures of these heat treatment steps should be selected to minimize the side diffusion.

The remaining steps are conventional contact opening and metallization steps, both well known in the art, which produce the completed device 10 as shown in FIG. 1.

What is claimed is:

1. An improved nonvolatile semiconductive memory device formed in a body of semiconductor material of N type conductivity having a surface with spaced source and drain regions of P type conductivity in said body adjacent to said surface and defining the ends of a channel region of controllable conductivity, a first insulating layer on said surface over said channel region, said first insulating layer having a thin, charge tunneling portion over part of said channel region and a thick non-tunneling portion over the rest of the said channel region, a second insulating layer on said first insulating layer, and a gate electrode layer on said second insulating layer, wherein the improvement comprises:
   at least a portion of said channel region beneath said thin portion of said first insulating layer having a concentration of conductivity modifiers of said N type greater than the concentration of conductivity modifiers in the portion of said channel region beneath said thick portion of said first insulating layer.

2. The device of claim 1 wherein said thin portion of said first insulating layer is disposed centrally over said channel region so that said part of said channel region has ends spaced from each of said source and drain regions.

3. The device of claim 1 wherein said semiconductive material is silicon, said thin portion of said first insulating layer is of silicon dioxide having a thickness of about 20 Å, and said thick portion of said first insulating layer is silicon dioxide having a thickness of about 500 Å.

4. The device of claim 3 wherein said second insulating layer is of silicon nitride.

5. The device of claim 4 wherein said conductivity modifiers in said portion of said channel region beneath said thin portion of said first insulating layer are phosphorus atoms.

6. A method of making an improved nonvolatile semiconductive memory device formed in a body of semiconductor material of one type conductivity having a surface with spaced source and drain regions of opposite type conductivity in said body adjacent to said surface and defining the ends of a channel region of controllable conductivity, a first insulating layer on said surface over said channel region, said first insulating layer having a thin, charge tunneling portion over part of said channel region and a thick non-tunneling portion over the rest of the said channel region, a second insulating layer on said first insulating layer and a gate electrode layer on said second insulating layer, comprising the step of:
   introducing conductivity modifiers into said portion of said channel region beneath said thin portion of said first insulating layer to increase the concentration thereof in said portion of said channel region to a value higher than the concentration of conductivity modifiers in the portion of said channel region beneath said thick portion of said first insulating layer.

7. The method of claim 6 wherein said conductivity modifiers are introduced by the process of ion implantation.

8. The method of claim 7 wherein said semiconductor material is N type silicon, said thin portion of said first insulating layer is silicon dioxide having a thickness of about 20 Å, said thick portion of said first insulating layer is silicon dioxide having a thickness of about 500 Å, said second insulating layer is silicon nitride, and said ion implanted conductivity modifiers are phosphorus atoms.

* * * * *